US011810845B2

United States Patent
Sorg et al.

(10) Patent No.: US 11,810,845 B2
(45) Date of Patent: Nov. 7, 2023

(54) CARRIER, ASSEMBLY COMPRISING A SUBSTRATE AND A CARRIER, AND METHOD FOR PRODUCING A CARRIER

(71) Applicant: OSRAM OLED GmbH, Regensburg (DE)

(72) Inventors: Jörg Erich Sorg, Regensburg (DE); Konrad Wagner, Regensburg (DE); Michael Förster, Altenthann (DE); Josef Hirn, Schwandorf (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/758,371

(22) PCT Filed: Oct. 30, 2018

(86) PCT No.: PCT/EP2018/079710
§ 371 (c)(1),
(2) Date: Apr. 22, 2020

(87) PCT Pub. No.: WO2019/091830
PCT Pub. Date: May 16, 2019

(65) Prior Publication Data
US 2020/0266139 A1 Aug. 20, 2020

(30) Foreign Application Priority Data
Nov. 9, 2017 (DE) .................. 10 2017 126 268.7

(51) Int. Cl.
*H01L 23/498* (2006.01)
*H01L 21/48* (2006.01)
(Continued)

(52) U.S. Cl.
CPC ...... *H01L 23/49827* (2013.01); *H01L 21/486* (2013.01); *H01L 25/0753* (2013.01);
(Continued)

(58) Field of Classification Search
CPC .......... H01L 33/62; H01L 33/641–644; H01L 2933/0066; H01L 2933/0075;
(Continued)

(56) References Cited

U.S. PATENT DOCUMENTS 6,661,088 B1 * 12/2003 Yoda ................. H01L 23/49833
257/700
7,808,013 B2 * 10/2010 Mendendorp, Jr. .. H05K 1/0206
257/99
(Continued)

FOREIGN PATENT DOCUMENTS

DE 102005041095 A1 5/2006
DE 102005041064 A1 3/2007
(Continued)

OTHER PUBLICATIONS

International Search Report Issued for corresponding International Application No. PCT/EP2018/079710; dated Jan. 14, 2019.

*Primary Examiner* — Shaun M Campbell
*Assistant Examiner* — Aneta B Cieslewicz
(74) *Attorney, Agent, or Firm* — ArentFox Schiff LLP

(57) ABSTRACT

Carrier with an electrically insulating base material, electrically conductive through-connections and a thermal connection element. The through-connections and the thermal connection element are each completely surrounded by the base material in the lateral direction, the thermal connection element and the through-connections completely penetrating the base material perpendicularly to the main extension plane of the carrier, and the thermal connection element being formed with a material which has a thermal conductivity of at least 200 W/(m K).

7 Claims, 7 Drawing Sheets

(51) Int. Cl.
*H01L 33/62* (2010.01)
*H01L 33/64* (2010.01)
*H01L 23/373* (2006.01)
*H01L 25/075* (2006.01)
*H01L 25/16* (2023.01)
*H01L 23/15* (2006.01)

(52) U.S. Cl.
CPC ............ H01L 25/167 (2013.01); H01L 33/62 (2013.01); H01L 33/641 (2013.01); H01L 33/642 (2013.01); *H01L 23/15* (2013.01); *H01L 23/373* (2013.01); *H01L 23/3731* (2013.01); *H01L 23/3732* (2013.01); *H01L 23/3733* (2013.01); *H01L 23/3736* (2013.01); *H01L 23/3738* (2013.01); *H01L 2224/48091* (2013.01); *H01L 2933/0066* (2013.01); *H01L 2933/0075* (2013.01)

(58) Field of Classification Search
CPC .............. H01L 25/167; H01L 25/0753; H01L 23/373–3738; H01L 23/49827; H01L 23/5384; H01L 21/486; H01L 2224/48091
See application file for complete search history.

(56) References Cited

U.S. PATENT DOCUMENTS

| | | | |
|---|---|---|---|
| 9,324,697 B1* | 4/2016 | Lin | G02B 26/0808 250/216 |
| 2005/0133698 A1* | 6/2005 | Oniki | G02B 26/0808 250/216 |
| 2007/0057364 A1* | 3/2007 | Wang | H01L 33/642 257/E25.02 |
| 2008/0043444 A1 | 2/2008 | Hasegawa et al. | |
| 2009/0108437 A1* | 4/2009 | Raymond | H01L 23/3735 257/713 |
| 2009/0267102 A1* | 10/2009 | Tsai | H01L 33/56 257/98 |
| 2009/0278162 A1 | 11/2009 | Wang et al. | |
| 2011/0250711 A1 | 10/2011 | Horiuchi et al. | |
| 2012/0049345 A1 | 3/2012 | Railkar et al. | |
| 2012/0068218 A1* | 3/2012 | Chang | H01L 33/642 257/99 |
| 2012/0168206 A1* | 7/2012 | Sekine | H01L 23/49827 174/252 |
| 2013/0163247 A1* | 6/2013 | Lee | F21V 29/83 362/249.01 |
| 2013/0228792 A1 | 9/2013 | Shim et al. | |
| 2015/0235919 A1* | 8/2015 | Sabathil | H01L 33/641 438/126 |
| 2015/0342027 A1* | 11/2015 | Feichtinger | H01L 33/642 174/252 |
| 2016/0013387 A1 | 1/2016 | Konishi et al. | |
| 2016/0095201 A1* | 3/2016 | Min | H01L 23/49827 361/709 |
| 2019/0112445 A1* | 4/2019 | Zhou | C01B 32/16 |
| 2020/0312904 A1* | 10/2020 | Hin | H01L 21/4853 |

FOREIGN PATENT DOCUMENTS

| | | |
|---|---|---|
| DE | 102009032253 A1 | 1/2011 |
| DE | 102012212968 A1 | 1/2014 |
| DE | 102015104641 A1 | 9/2016 |
| WO | 2016/020537 A1 | 2/2016 |
| WO | 2017/121725 A1 | 7/2017 |
| WO | 2017121725 A1 | 7/2017 |

* cited by examiner

CARRIER, ASSEMBLY COMPRISING A SUBSTRATE AND A CARRIER, AND METHOD FOR PRODUCING A CARRIER

This application is a 35 U.S.C. § 371 National Phase of PCT Application No. PCT/EP2018/07910, filed Oct. 30, 2018, which claims priority to German Application No. 10 2017 126 268.7, filed Nov. 9, 2017, the disclosures of which are hereby incorporated by reference herein.

A carrier and an assembly with a carrier and a substrate are specified. In addition, a method for producing a carrier is specified.

One of the tasks to be solved is to specify a carrier which has improved thermal properties and which can be produced particularly cost-effectively. A further task to be solved is to specify a cost-effective method for producing a carrier.

For example, the carrier is a mechanically self-supporting component. The carrier is in particular a carrier for an electronic component. The carrier is then in particular configured to mechanically support, carry and/or electrically contact at least one electronic component. For example, an electronic component can be mounted on a main surface of the carrier and can be contacted electrically by means of the carrier. In particular, the carrier may be configured to dissipate heat generated during operation of an electronic component mounted on the carrier from the electronic component. In particular, the carrier is particularly suitable for optoelectronic components such as light-emitting diodes, light-emitting diode chips, laser diodes or laser diode chips, in order to make electrically conductive contact with them and to dissipate heat generated during operation.

According to at least one embodiment, the carrier comprises an electrically insulating base material. The electrically insulating base material is formed with a polymer or a ceramic, for example. In particular, the base material is formed by a moulding process, a casting process, a dispensing process or a printing process. The base material can be filled with fillers. The fillers may be particles of a material, which after the production of the base material are in particular evenly distributed in the base material. For example, the coefficient of thermal expansion, the reflectivity and/or the thermal conductivity of the base material can be adjusted by means of the fillers. For example, the base material comprises $SiO_2$, $TiO_2$, $BaSO_4$, $Al_2O_3$, AlN and/or BN as fillers.

According to at least one embodiment, the carrier includes electrically conductive through-connections. The through-connections may be formed, for example, by an electrically conductive material, in particular by a metallic material. In particular, the through-connections are not continuous. The through-connections may, for example, be electrically insulated from each other by means of the base material.

According to at least one embodiment, the carrier comprises a thermal connection element. The thermal connection element is formed, for example, with a material that has a particularly high thermal conductivity. In particular, the thermal connection element may be formed with a metal, especially copper. Furthermore, the thermal connection element may be formed with the following materials: aluminium nitride (AlN), polycrystalline or monocrystalline silicon carbide (SiC), a mixture with diamond powder in a matrix comprising copper, diamond or a mixture with carbon nanotubes (CNT) in a matrix comprising silver.

According to at least one embodiment, the through-connections and the thermal connection element are each completely surrounded by the base material in lateral directions. For example, the lateral directions are parallel to a main extension plane of the carrier. In particular, the through-connections and/or the thermal connection element do not have any outwardly exposed surfaces in lateral directions. The lateral surfaces of the thermal connection element and/or the through-connections, for example, are completely covered with the base material. For example, the base material is cohesively connected to the thermal connection element and/or the through-connections.

According to at least one embodiment, the thermal connection element and the through-connections completely penetrate the base material perpendicular to the main extension plane of the carrier. For example, the carrier comprises a first and a second main surface formed on opposite sides of the carrier. In particular, the thermal connection element and/or through-connections may be exposed to the outside on the first main surface and/or the second main surface. In particular, the through-connections and/or the thermal connection element are not covered with electrically insulating base material on the first main surface and/or on the second main surface. The main surfaces may at least in places run parallel to the main extension plane of the carrier.

According to at least one embodiment, the thermal connection element is formed with a material having a thermal conductivity of at least 200 W/(m K). For example, the thermal connection element is formed with a polymer and/or a ceramic material. The thermal connection element may have a crystal structure. The thermal connection element may be formed with a material comprising a solid mixture of several components. In particular, the thermal connection element is not formed with the same material as the base material. Furthermore, the thermal conductivity of the thermal connection element can be directional. In particular, the thermal connection element has a thermal conductivity of at least 200 W/(m K), in particular at least 800 W/(m K), transverse, in particular perpendicular, to the main extension plane of the carrier.

For example, the thermal connection element is formed with aluminium nitride (AlN) and has a thermal conductivity between 200 W/(m K) and 230 W(m K) inclusive. The thermal connection element may be formed with silicon carbide (SiC) and have a thermal conductivity between 350 W/(m K) and 430 W/(m K) inclusive. Further, the thermal connection element may be formed with copper (Cu) and have a thermal conductivity of at least 380 W/(m K). Alternatively, the thermal connection element may be formed with diamond powder embedded in a copper-containing matrix and have a thermal conductivity of at least 550 W/(m K). In particular, the thermal connection element is formed with graphite and has a thermal conductivity between 900 W/(m K) and 1300 W/(m K) inclusive. The thermal connection element may be formed with diamond and have a thermal conductivity between 1000 W/(m K) and 2500 W/(m K) inclusive. Alternatively, the thermal connection element is formed with carbon nanotubes (CNT) and has a thermal conductivity of 6000 W/(m K) at least along one direction.

According to one embodiment, the carrier comprises an electrically insulating base material, electrically conductive through-connections and a thermal connection element. The through-connections and the thermal connection element are each completely surrounded by the base material in the lateral direction, the thermal connection element and the through-connections completely penetrating the base material perpendicular to the main extension plane of the carrier, and the thermal connection element being formed with a material having a thermal conductivity of at least 200 W/(m K).

According to one embodiment, the carrier comprises an electrically insulating base material, electrically conductive through-connections and a thermal connection element. The through-connections and the thermal connection element are each completely surrounded by the base material in the lateral direction, the thermal connection element and the through-connections completely penetrating the base material perpendicular to the main extension plane of the carrier, and the thermal connection element being formed with a material having a thermal conductivity of at least 200 W/(m K).

The following considerations, among others, form the basis of a carrier described here: In general, carriers are manufactured with a core of a metallic material coated with a dielectric layer. Electronic components are then mounted on the dielectric layer. The material of the dielectric lies in the heat dissipation path, which reduces the heat that can be dissipated during operation of the electronic component.

The carrier described here now makes use of the idea of providing a carrier with a thermal connection element which is exposed on the first and second main surfaces of the carrier. This allows electronic components to be placed directly on the exposed surface of the thermal connection element, so that heat generated during operation can be dissipated particularly well. Advantageously, the thermal connection element can be adapted to the size of the electronic component to be mounted on the carrier, regardless of the size of the carrier. This means that a particularly small amount of the material of the thermal connection element is sufficient to produce a carrier, so that the carrier can be manufactured particularly cost-effectively.

According to at least one embodiment, the thermal connection element and the through-connection comprise different materials or consist of different materials. In this way, it is possible to select the optimum material composition for each the thermal connection element and the through-connection. Surprisingly, it turned out that this advantage can outweigh the disadvantage of a more complicated production.

According to at least one embodiment, at least one through-connection per square millimeter is arranged on average along the main extension plane of the carrier. In particular, at least five through-connections are arranged along the main extension plane of the carrier per square millimeter. In particular, the through-connections are arranged periodically, for example at the nodes of a regular grid, along the main extension plane of the carrier. The through-connections can each be electrically conductively connected on the first and/or second main surface of the carrier. For example, electronic components mounted on the carrier can be electrically conductively contacted and operated via the through-connections. Advantageously, the carrier has a particularly high number of through-connections per area along its main extension plane. This means that a particularly large number of electronic components can be electrically conductively contacted separately from each other on the carrier.

According to at least one embodiment, the through-connections comprise side surfaces which directly adjoin the base material, wherein the side surfaces of the through-connections are at least partially do not extend perpendicular to the main extension plane of the carrier. For example, the through-connections taper and/or thicken from the first main surface of the carrier towards the second main surface of the carrier. The through-connections may, for example, have a circular or a polygonal contour in plan view of the main surface of the carrier. In particular, a through-connection comprises a different contour in plan view of the first main surface than in plan view of the second main surface. Advantageously, the through-connections can be designed in such a way that the through-connections are mechanically connected to the base material in a form-fit manner, so that the mechanical connection between the base material and the through-connections is particularly stable.

According to at least one embodiment, the through-connections comprise multiple layers, wherein layers of the through-connection each have a maximum thickness of 60 µm. In particular, the layers of the through-connections may have different material compositions. For example, different through-connections have a same layer sequence. For example, a through-connection comprises between 2 and 8 layers inclusive. A through-connection, for example, may have a thickness between 50 µm and 500 µm inclusive. Advantageously, a multi-layer structure of the through-connections allows a particularly good adaptation of the electrical, thermal and/or mechanical properties of the through-connections.

According to at least embodiment, a through-connections is step-shaped on its side surface, wherein the height of steps is 60 µm maximum. For example, the individual layers of the through-connections have a different expansion in the lateral direction, so that the through-connections have a step-shaped profile in the region of their side surfaces. Advantageously, this enables a particularly good mechanical, especially form-fit, connection between the through-connections and the base material. The through-connections can thus be particularly well anchored in the base material, so that the risk of the through-connections being detached is reduced.

According to at least embodiment, contact structures are formed on a first main surface of the carrier, wherein the contact structures are in direct mechanical contact with the through-connections and/or the thermal connection element and the contact structures are formed with an electrically conductive material. The contact structures are formed, for example, with copper, nickel, palladium and/or gold. In particular, the contact structures are formed in several layers. The contact structures may be configured to be electrically connected to an electronic component. In particular, the contact structures are formed as contact pads so that electronic components can be connected to the contact structures by soldering or wire bonding. In particular, the contact structures protrude laterally beyond the through-connections and/or the thermal connection element with which the contact structures are each electrically conductively connected. For example, the contact structures are at least partially arranged on the base material. In particular, the contact structures are arranged overlapping with exactly one through-connection or the thermal connection element. Advantageously, the geometry of the contact structures can be selected independently of the geometry of the through-connections and/or the thermal connection element.

According to at least one embodiment, a metallization is arranged on a second main surface of the carrier in the region of the thermal connection element and in the region of the through-connections. The metallization may be formed with nickel, palladium and/or gold, for example. In particular, the metallization is not formed continuously. For example, the metallization completely covers the through-connections and/or the thermal connection element on the second main surface. For example, the metallization is exclusively arranged in the region of the through-connections and/or the thermal connection element. In particular, the base material is free of the metallization and not covered by it. Advantageously, the carrier can be contacted electrically and/or thermally particularly efficiently by means of the metallization.

According to at least one embodiment, the carrier comprises electronic components embedded in the carrier. For example, the electronic components are active or passive electronic components. In particular, the electronic components may include resistors, ESD protection elements, temperature sensors and/or logic components. For example, the electronic components may be electrically contactable on the first and/or second main surface of the carrier. Alternatively, the electronic components may be electrically contactable by means of the through-connections. In particular, the electronic components are completely surrounded by the base material in lateral directions. The advantage of embedding electronic components in the carrier is the space-saving integration of electronic components.

An assembly comprising a carrier and a substrate is further specified. In particular, the assembly may comprise a carrier described herein. This means that all features disclosed for the carrier are also disclosed for the carrier of the assembly and vice versa.

According to at least one embodiment of the assembly, the substrate is arranged on a side of the metallization of the carrier facing away from the base material, wherein the substrate comprises at least one conductor track and at least one heat sink, the metallization, which is arranged in the region of the through-connections, is in direct contact with the conductor track, and the metallization, which is arranged in the region of the thermal connection element, is in direct contact with the heat sink. In particular, the substrate can have a plurality of conductor tracks which are electrically conductively connected to the through-connections. For example, the substrate can be a printed circuit board. For example, the heat sink is formed with a material that has a thermal conductivity of at least 10 W/(m K). In particular, the thermal conductivity of the heat sink is lower than the thermal conductivity of the thermal connection element. For example, the heat sink is configured such that heat can be transferred to the heat sink via the thermal connection element. In particular, by the thermal connection element heat generated during operation of an electronic component mounted on the carrier is transferred to the heat sink. In particular, the assembly may comprise several carriers which are in direct contact with a common substrate. For example, a large number of carriers are arranged on one surface of the substrate. Advantageously, the substrate allows both electrically conductive contacting and heat dissipation of electronic components mounted on the carrier.

A method for the production of a carrier is further specified. In particular, the method can be used to produce a carrier described here. This means that all the features disclosed for the carrier are also disclosed for the method and vice versa. In the following, the method is divided into several steps, each of which is designated by a letter. In particular, the method can be carried out according to the alphabetical order of the method steps.

According to at least one embodiment, an electrically conductive first auxiliary carrier is provided in method step A). The first auxiliary carrier is, for example, a self-supporting first auxiliary carrier. The first auxiliary carrier has a flat construction, for example. In particular, the first auxiliary carrier may be formed with copper.

According to at least one embodiment of the method, at least one thermal connection element is arranged on the first auxiliary carrier in a step B). For example, the thermal connection element is arranged on the first auxiliary carrier by means of a bonding process and is mechanically fixedly connected with it. Alternatively, the thermal connection element can be mechanically fixedly connected to the first auxiliary carrier by means of adhesive bonding or soldering. Alternatively, the thermal connection element can be manufactured additively on the first auxiliary carrier.

In addition, electronic components may be arranged on the first auxiliary carrier at a lateral distance from the thermal connection element. For example, the electronic components may be active or passive components such as temperature sensors, ESD protection elements or logic modules. In addition, electrically conductive layers may be arranged on the first auxiliary carrier laterally spaced from the thermal connection element.

According to at least one embodiment of the method for producing a carrier, at least one through-connection is arranged on the first auxiliary carrier in a step C). The through-connection is, for example, arranged on the first auxiliary carrier at a lateral distance from the thermal connection element. In particular, the through-connection is manufactured additively on the first auxiliary carrier.

According to at least one embodiment of the method, a base material is applied to the first auxiliary carrier in a step D), wherein the base material completely surrounds the through-connection and the thermal connection element in lateral directions. For example, the base material is arranged on the first auxiliary carrier by means of a moulding process, a casting process, a dispensing process or a printing process. In particular, side surfaces of the through-connection, the thermal connection element and possibly the electronic components are completely covered by the base material.

According to at least one embodiment, contact structures are applied to a side of the thermal connection element and the through-connection facing away from the first auxiliary carrier in a step E). For example, a metal layer is deposited over the entire surface on the side of the thermal connection element, the through-connection and the base material facing away from the first auxiliary carrier. For example, the metal layer is deposited by sputtering. In particular, the metal layer includes copper, nickel, palladium and/or gold. Subsequently, further layers of the contact structures are deposited on the whole surface of the metallization by means of a lithography process in places. In particular, the contact structures may comprise electrodeposited copper and/or electrolessly deposited nickel, palladium and/or gold. Furthermore, the contact structures may have a surface on a side facing away from the through-connection which can be contacted particularly well by soldering and, for example, this surface may be formed with palladium and gold. In particular, the thermal connection element may be free of contact structures so that a contact structure is formed exclusively on the through-connection. For example, the thermal connection element has a surface facing away from the first auxiliary carrier, which can be contacted by soldering.

According to at least one embodiment of the method, a second auxiliary carrier is arranged on a side of the contact structures facing away from the first auxiliary carrier in a method step F). For example, the second auxiliary carrier can cohesively connected to the contact structures by means of an adhesive. The adhesive may, for example, surround the contact structures in a lateral direction. In particular, the second auxiliary carrier is in direct mechanical contact with the base material. For example, the second auxiliary carrier completely covers the contact structures and/or the base material. The second auxiliary carrier may protect the contact structures, the thermal connection element and/or the through-connection against damage, for example by an etching solution.

According to at least one embodiment of the method, the first auxiliary carrier is removed in step G). For example, the first auxiliary carrier is removed by means of an etching process, in particular using sulphuric acid. In particular, the first auxiliary carrier is completely removed. For example, after removal of the first auxiliary carrier, the base material, the thermal connection element and the through-connection are exposed on a side facing away from the second auxiliary carrier.

According to at least one embodiment of the method, a metallization is applied to a side of the thermal connection element and/or the through-connection facing away from the second auxiliary carrier in a step H). For example, the metallization is deposited electrolessly. In particular, the metallization may include nickel, palladium and/or gold. Alternatively, the metallization can be electrodeposited. In particular, the metallization can include copper. The metallization completely covers the through-connection and/or the thermal connection element on a side facing away from the second auxiliary carrier. In particular, the base material is free from the metallization.

According to at least one embodiment of the method, the second auxiliary carrier is removed in a method step I). For example, the second auxiliary carrier is mechanically detached. For example, the second auxiliary carrier is removed from the carrier as a whole.

According to at least one embodiment of the method, in a step H1), which is carried out after step H), a third auxiliary carrier is arranged on a side of the metallization facing away from the second auxiliary carrier. For example, in steps A) to H) a plurality of carriers are produced in a common process. In particular, the carriers are singulated so that the carriers are mechanically connected to one another exclusively by means of the third auxiliary carrier.

According to at least one embodiment of the method, the through-connection in step C) is produced by means of a photolithographic process. For example, the through-connection is formed by means of several layers, each of which is produced by means of a photolithographic process. In particular, the individual layers of the through-connection have different contours in plan view. For example, the individual layers can be used each to form one step of a step-shaped through-connection.

According to at least one embodiment of the method, in a step D1), which is carried out after step D), the side of the base material, the through-connection and the thermal connection element facing away from the first auxiliary carrier is planarized. For example, the planarization is carried out by means of a grinding and/or polishing process. In particular, planarization exposes the through-connection and/or the thermal connection element. For example, during planarization, base material is removed which covers the through-connection and/or the thermal connection element on a side facing away from the first auxiliary carrier.

According to at least one embodiment of the method, in step E) a seed layer is applied over the entire surface of the side of the base material, the through-connection and the thermal connection element facing away from the first auxiliary carrier and the contact structure is electrodeposited. In particular, the contact structure is structured photolithographically. In this process, the seed layer may be at least partially removed, so that the individual contact structures are not continuously formed. In particular, individual contact structures are electrically insulated from each other.

According to at least one embodiment of the method, a plurality of carriers is produced in steps A) to I) and the carriers are subsequently singulated in a step J). For example, the carriers are singulated by means of an etching process, a sawing process and/or a laser cutting process.

According to at least one embodiment of the method, a substrate is arranged on a side of the metallization facing away from the base material after step I), wherein the substrate comprises at least one conductor track and at least one heat sink, the metallization, which is arranged in the region of the through-connection, is brought into direct contact with the conductor track, and the metallization, which is arranged in the region of the thermal connection element, is brought into direct contact with the heat sink. In particular, an electronic component is mounted on the carrier on a side of the metallization facing away from the base material before the substrate is arranged. The electronic component is, for example, electrically conductively connected to at least one through-connection. For example, the electronic component is connected electrically conductively to a through-connection by means of a bonding wire.

According to at least one embodiment, step H) is carried out immediately after step G).

Advantageous embodiments and developments of the carrier and the method for producing a carrier will become apparent from the exemplary embodiments described below in association with the figures.

In the exemplary embodiments and figures, similar or similarly acting constituent parts are provided with the same reference symbols. The elements illustrated in the figures and their size relationships among one another should not be regarded as true to scale. Rather, individual elements may be represented with an exaggerated size for the sake of better representability and/or for the sake of better understanding.

Figure 1:
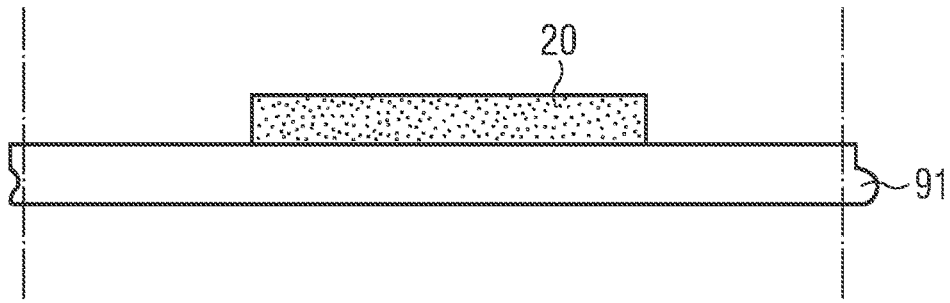
FIGS. 1 to 16 show a schematic view of the steps of an exemplary embodiment of the method for producing a carrier.

FIG. 1 shows a schematic sectional view of a first auxiliary carrier 91 and a thermal connection element 20 according to an exemplary embodiment of a method for producing a carrier. In the method, an electrically conductive first auxiliary carrier 91 is provided in a step A). The first auxiliary carrier 91 is formed with copper, for example. In a step B) at least one thermal connection element 20 is arranged on the first auxiliary carrier 91. In particular, the thermal connection element 20 is in direct contact with the first auxiliary carrier 91 on a main surface of the first auxiliary carrier 91. Alternatively, the thermal connection element 20 can be cohesively connected to the first auxiliary carrier 91 by means of an adhesive or by means of a soldering material. The thermal connection element 20 is formed with a material that has a thermal conductivity of at least 200 W/(m K). In particular, the thermal connection element 20 has a thermal conductivity that is higher than the thermal conductivity of copper. Furthermore, in step B), in addition to the thermal connection element 20, electronic components 70 can be arranged on the first auxiliary carrier 91. The electronic components can be temperature sensors, protection diodes and/or other active or passive electronic components. In particular, the electronic components 70 are not in direct contact with the thermal connection element 20. It is possible that the material of the thermal connection element 20 is electrically conductive or electrically insulating.

Figure 2:
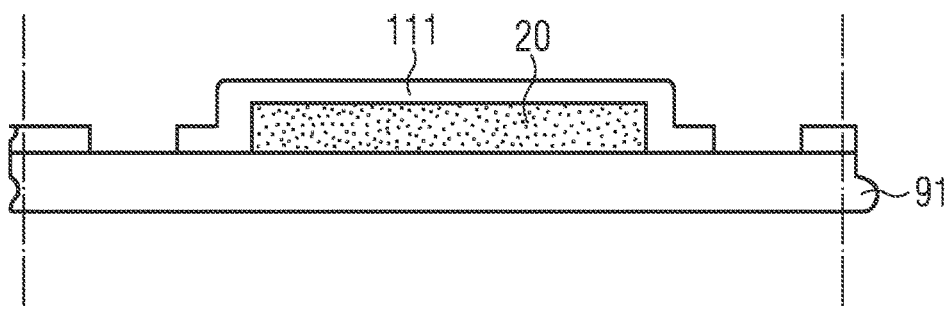

FIGS. 2 to 6 show step C) of the method for producing a carrier in a schematic sectional view according to an exemplary embodiment. In step C) at least one through-connection 10 is arranged on the first auxiliary carrier 91. As shown in FIG. 2, a first mask 111 is first arranged on a main surface of the first auxiliary carrier 91 and on the thermal connection element 20. In particular, the first mask 111 completely covers the thermal connection element 20. In regions where the through-connection 10 are to be placed, the first mask 111 has cut-outs. In these cut-outs the first auxiliary carrier 91 is free of the first mask 111. The first mask is, for example, a photosensitive resist which can be structured by exposure and development.

Figure 3:
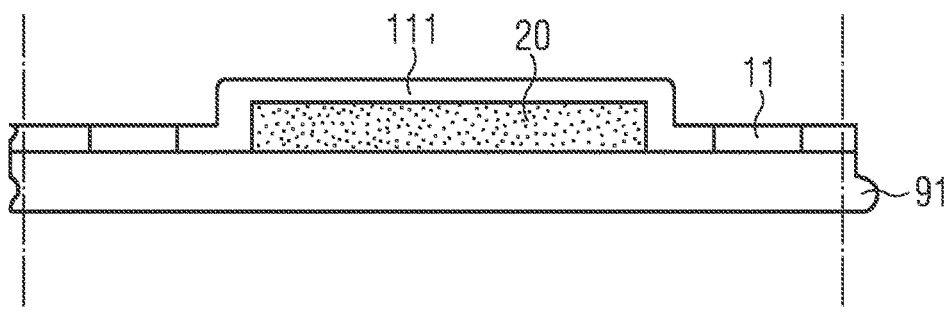

As shown in FIG. 3, a first sublayer 11 is formed in the regions of the cut-outs in the first mask 111. The first sublayer 11 is deposited, for example, electrodeposited on the first auxiliary carrier 91. In particular, the first sublayer 11 is formed with copper. The first sublayer 11 has the same thickness as the first mask 111 perpendicular to the main extension plane of the first auxiliary carrier 91. For example, the thickness of the first sublayer 11 is a maximum of 60 µm, in particular a maximum of 80 µm.

Figure 4:
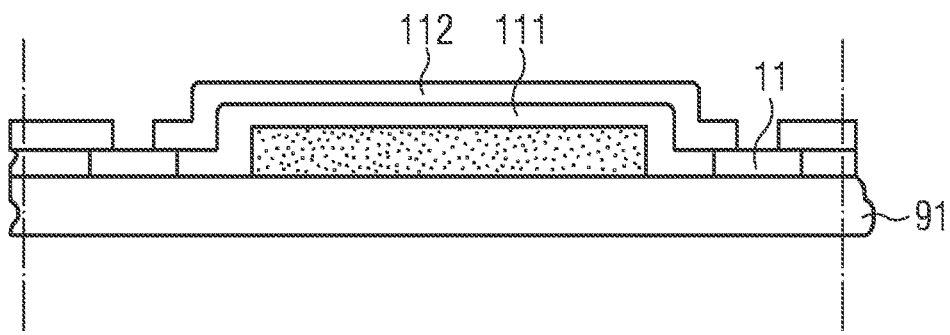

As shown in FIG. 4, a second mask 112 is arranged on the side of the first mask 111 facing away from the first auxiliary carrier 91. For example, the second mask 112 is a photosensitive resist. In particular, the second mask 112 has cut-outs in the region of the first sublayer 11. The first sublayer 11 is at least partially exposed to the outside and is not completely covered by the second mask 112. Along the main extension plane of the first auxiliary carrier 91, the cut-out in the second mask 112 is smaller than the cut-out in the first mask 111.

Figure 5:
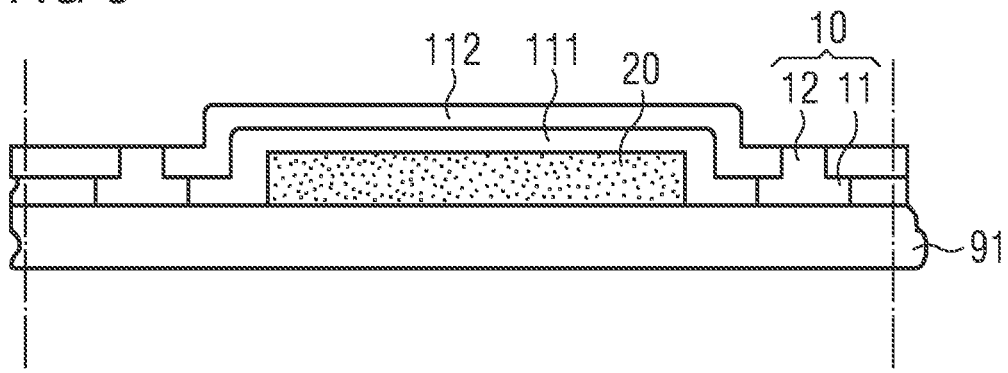

As shown in FIG. 5, a second sublayer 12 is formed in the region of the cot-outs in the second mask 112. For example, the second sublayer 12 is electrodeposited. In particular, the second sublayer 12 can be formed with copper. For example, the first sublayer 11 and the second sublayer 12 are formed with the same material, in particular with the same material as the first auxiliary carrier 91. Together, the first sublayer 11 and second layer 12, which are cohesively connected to one another, form a through-connection 10.

Figure 6:
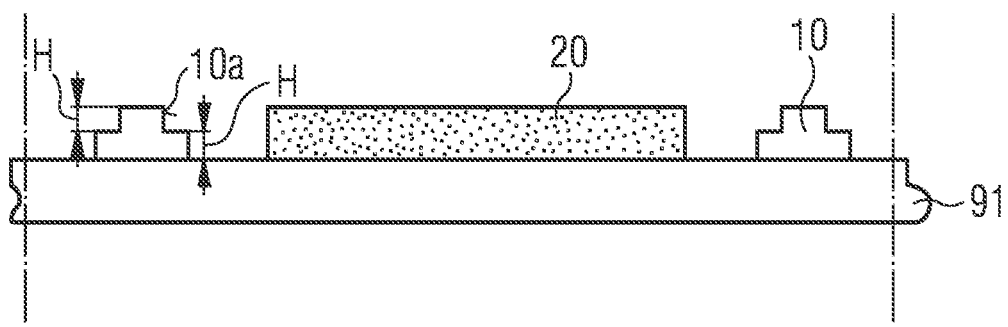

As shown in FIG. 6, the first mask 111 and the second mask 112 are completely removed. For example, after removing the first and second mask 11, 12 at least one through-connection per mm² is located on the first auxiliary carrier 91. The through-connections are each formed in step-shaped, with the height H of the steps each being 60 µm maximum.

Figure 7:
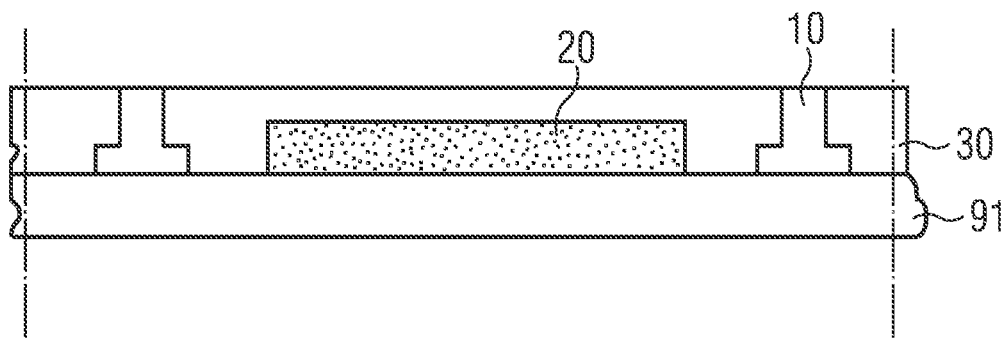

FIG. 7 shows in a schematic sectional view the step D) of a method for producing a carrier 100 in a schematic sectional view according to an exemplary embodiment. In step D) a base material 30 is applied to the first auxiliary carrier 91, whereby the base material 30 completely surrounds the through-connection 10 and the thermal connection element 20 in lateral directions. Lateral directions run along the main extension plane of the first auxiliary carrier 91. The base material 30 can be arranged on the first auxiliary carrier 91, for example by means of a film assisted molding process, dispensing, screen printing or stencil printing. The base material 30 is an electrically insulating material. For example, the base material 30 is formed with a polymer in which a filler is arranged. The filler is for example SiO2, TiO2, BaSO4, Al2O3, AlN or BN. Advantageously the coefficient of thermal expansion, the reflectivity and/or the thermal conductivity of the base material 30 can be adjusted by means of the filler.

Figure 8:
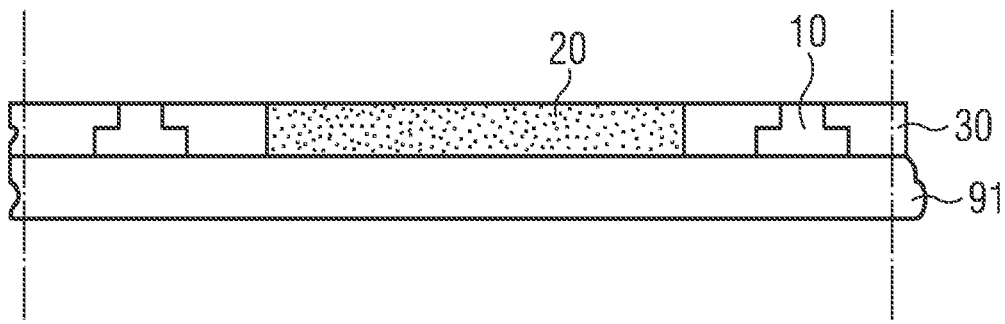

FIG. 8 shows a step of a method for producing a carrier 100 in a schematic sectional view according to an exemplary embodiment, wherein the base material 30, the through-connections 10 and the thermal connection element 20 are planarized on their side facing away from the first auxiliary carrier 91. For example, the planarization is carried out using a grinding and/or polishing process. In particular, the through-connections 10 and the thermal connection element 20 are exposed on their side opposite the first auxiliary carrier 91.

Figure 9:
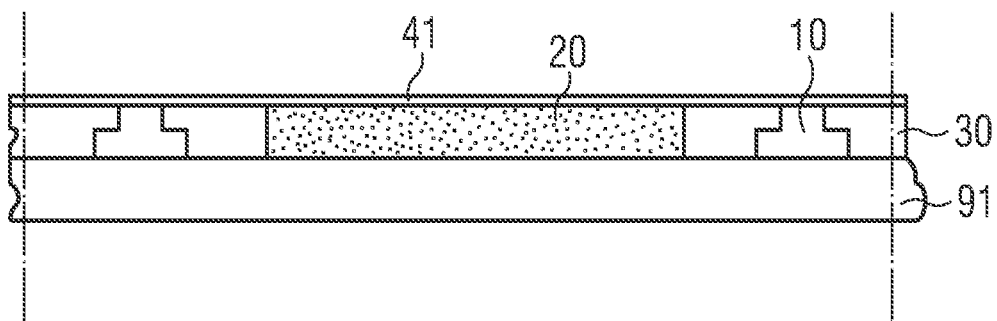

FIGS. 9 to 12 show in a schematic sectional view a step E) of the method for manufacturing a carrier 100 according to an exemplary embodiment. As shown in FIG. 9, a seed layer 41 is applied over the entire surface of the base material 30, the through-connection 10 and the thermal connection element 20 facing away from the first auxiliary carrier 91. For example, the seed layer 41 is deposited using a sputtering process. In particular, the seed layer 41 can be formed with copper, nickel, palladium and/or gold. In particular, the seed layer is electrically conductive. The seed layer 41 completely covers the through-connections 10, the thermal connection element 20 and the base material 30 on the side facing away from the first auxiliary carrier 91.

Figure 10:
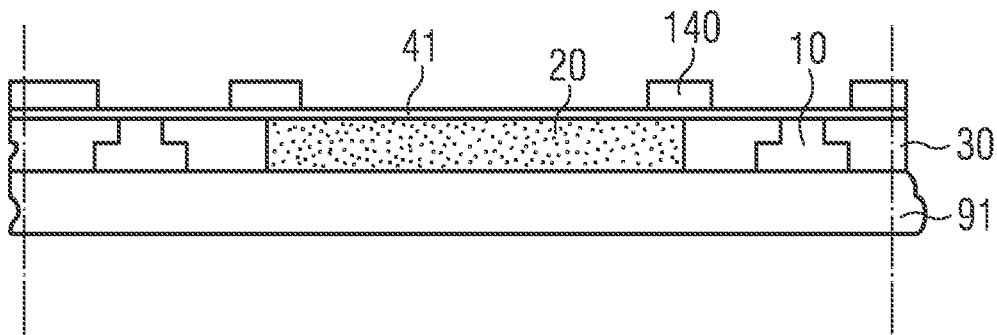

As shown in FIG. 10, a third mask 140 is applied to the seed layer 41. The third mask 140 is formed, for example, with a light-sensitive resist. In particular, the third mask 140 has cut-outs in which the seed layer 41 is free of the third mask. Contact structures 40 are formed in the region of the cout-outs in the third mask 140. In particular, the third mask 140 does not overlap at least partially with the through-connections 10 and/or the thermal connection element 20 perpendicular to the main extension plane of the first auxiliary carrier 91.

Figure 11:
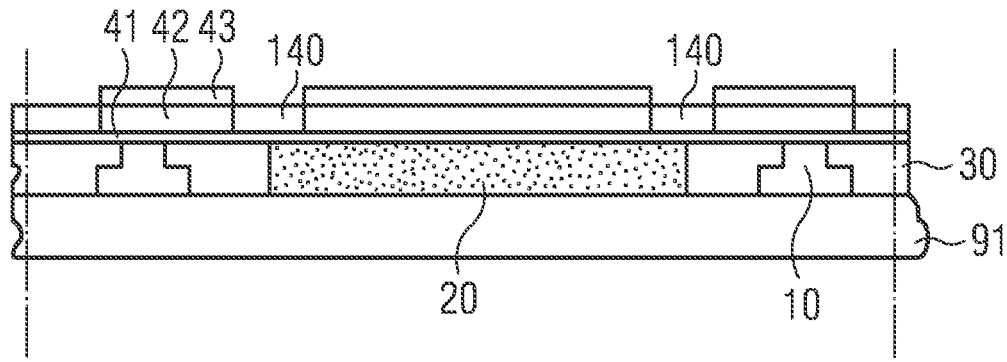

As shown in FIG. 11, a first contact structure layer 42 and a second contact structure layer 43 are formed in the region of the cut-outs of the third mask 140. The first contact structure layer 42 may be formed with nickel, palladium and/or gold, for example. In particular, the material of the first contact structure layer 42 can be deposited electroless on the seed layer 41, for example by vapour deposition or sputtering. The second contact structure layer 43 may be formed with palladium or gold, for example. In particular, the second contact structure layer 43 can be electrically contacted by soldering. According to an alternative embodiment, the thermal connection element may be electrically conductively contacted by soldering on a side facing away from the first auxiliary carrier 91, wherein in this case the thermal connection element 20 may be free of a contact structure 40.

In the lateral direction, the contour of the contact structure 40 can be specified by means of the cut-outs in the third mask 140. For example, the contact structures in the lateral direction can be as large as the through-connections 10 with which the contact structures 40 are each in direct contact. In particular, the contact structures 40 can project beyond the through-connections 10, with which the contact structures 40 are each in direct contact, in lateral direction. In particular, contact structures 40, which are electrically conductively connected to different through-connections or the thermal connection element 20, are not continuous.

Figure 12:
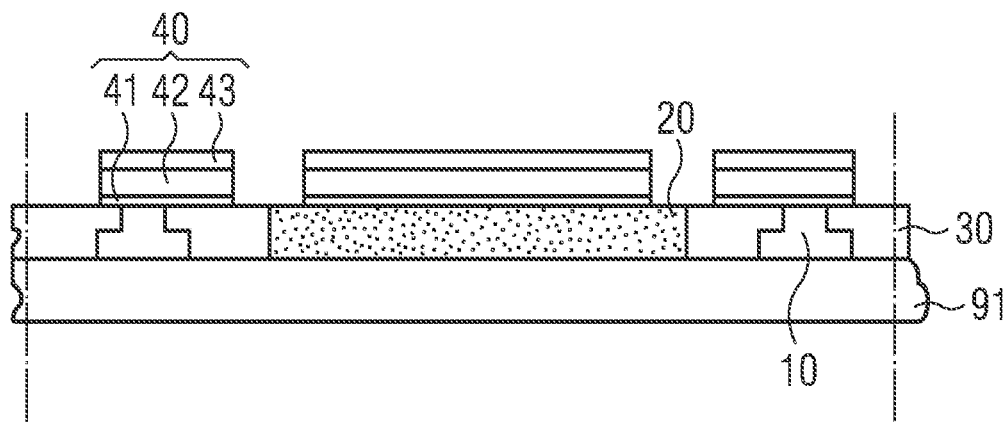

As shown in FIG. 12, the third mask 140 is completely removed. For example, the third mask 140 is completely removed by means of an etching process.

Figure 13:
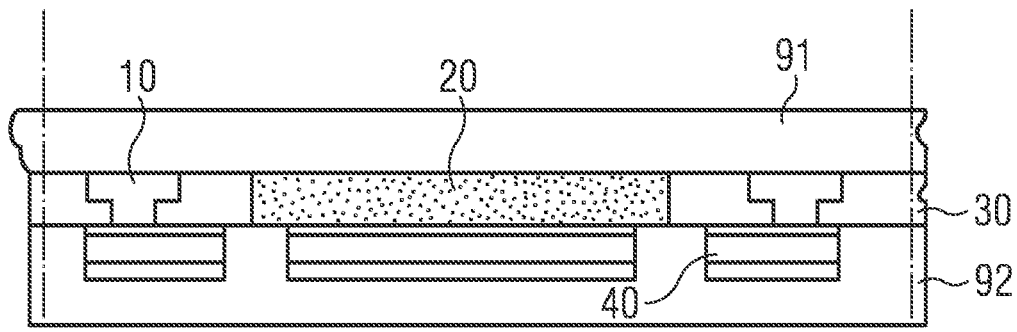

FIG. 13 shows a schematic representation of a step F) of the method for producing a carrier 100 according to an exemplary embodiment. In step F) a second auxiliary carrier 92 is arranged on a side of the contact structures 40 facing away from the first auxiliary carrier 91. In particular, the second auxiliary carrier 92 is also arranged on a side of the base material 30, the thermal connection element 20 and/or the through-connections 10 facing away from the first auxiliary carrier 91. For example, the second auxiliary carrier 92 is a flexible carrier which adapts to the surface structure on the side facing away from the first auxiliary carrier 91. In particular, the second auxiliary carrier 92 completely covers surfaces facing away from the first auxiliary carrier 91 and thus protects them, for example during an etching process.

Figure 14:
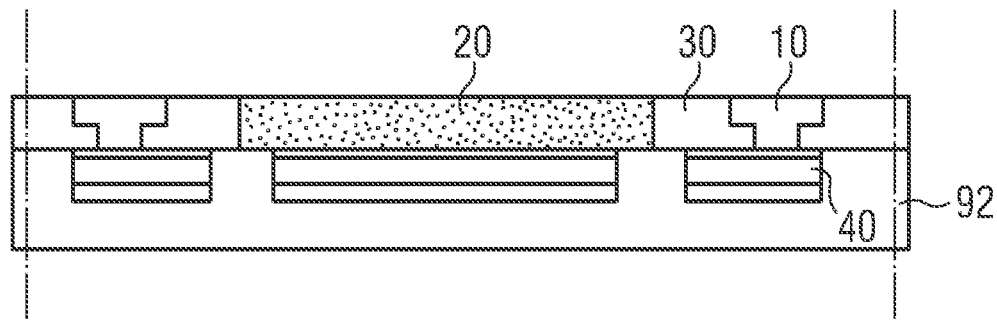

FIG. 14 shows a schematic representation of a step H) for producing a carrier 100 according to an exemplary embodiment. In this step, the first auxiliary carrier 91 is removed. For example, the first auxiliary carrier 91 is removed by means of an etching process, especially with sulphuric acid. After step G), the side of the thermal connection element 20, the through-connections 10 and the base material 30 facing away from the contact structure 40 is exposed to the outside.

Figure 15:
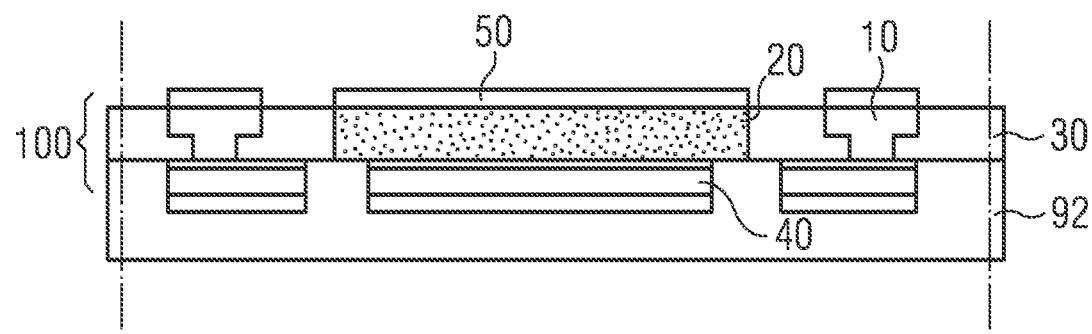

FIG. 15 shows a schematic representation of step H) of a method described here for producing a carrier 100 according to an exemplary embodiment. In step H) a metallization 50 is applied to a side of the thermal connection element 20 and/or the through-connections 10 facing away from the second auxiliary carrier 92. For example, the metallization 50 is deposited electroless. In particular, the metallization comprises nickel, palladium and/or gold. As an alternative to the embodiment shown here, the metallization 50 can also be produced lithographically using a process described in connection with the contact structure 40.

Figure 16:
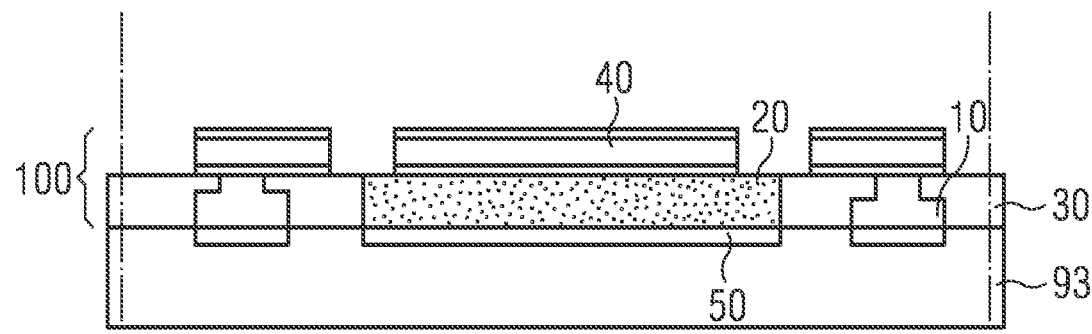

FIG. 16 shows a schematic representation of a step I) of the method for producing a carrier according to an exemplary embodiment. In step I), the second auxiliary carrier 92 is completely removed. For example, the second auxiliary carrier 92 is removed chemically and/or mechanically. In particular, before the second auxiliary carrier 92 is removed, a third auxiliary carrier 93 can be arranged on a side of the metallization 50 facing away from the second auxiliary carrier 92. In particular, the third auxiliary carrier 93 may also be in direct mechanical contact with the base material 30 on a side facing away from the second auxiliary carrier 92. In particular, the third auxiliary carrier 93, the metallization 50 and the base material 30 are cohesively connected to each other. For example, the third auxiliary carrier 93 is so-called blue tape.

In particular, the steps A) to I) are carried out in the above-mentioned sequence during the production of the carrier.

In particular, the method described in FIGS. 1 to 16 can be used to produce a large number of carriers 100 simultaneously in a composite. The carriers 100 are then singulated along the dotted lines in step J). For example, the carriers 100 are singulated by means of a laser cutting process, by etching or by sawing. For example, the singulated carriers 100 are mechanically connected exclusively by means of the third carrier 93.

Furthermore, a substrate 60 can be arranged on a side of the metallization 50 facing away from the base material 30 subsequent to step I), wherein the substrate 60 comprises at least one conductor track 62 and at least one heat sink 61. The metallization 50, which is arranged in the region of the through-connection 10, is brought into direct contact with the conductor track 62, and the metallization 50, which is arranged in the region of the thermal connection element 20, is brought into direct contact with the heat sink 61. Such an exemplary embodiment is shown in connection with FIG. 17.

Figure 17:
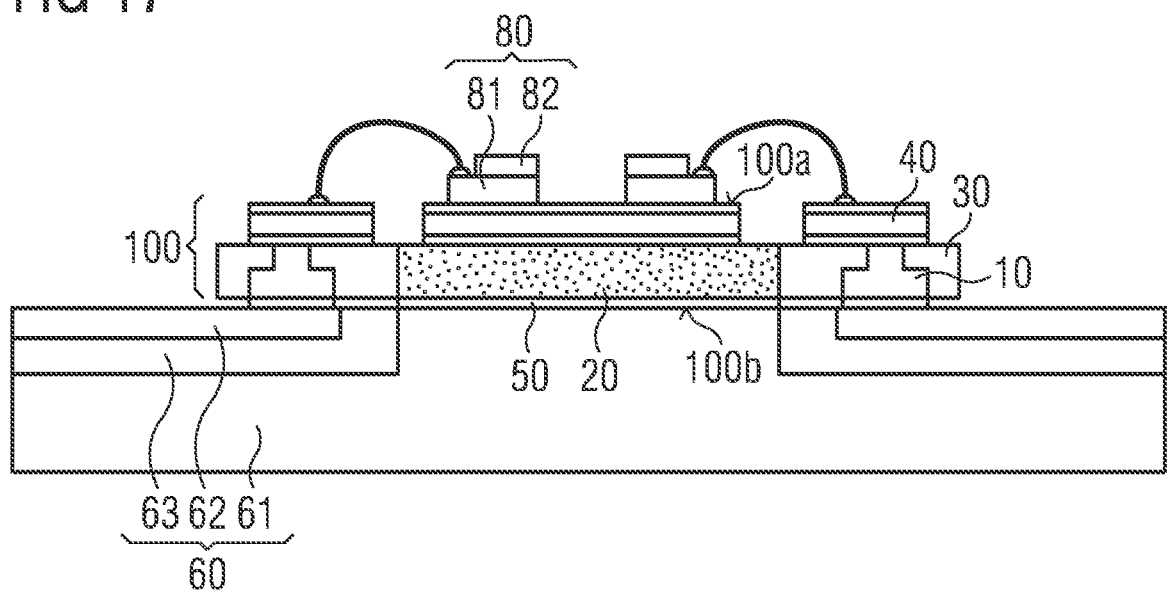
FIG. 17 shows a schematic view of an exemplary embodiment of a carrier which is arranged on a substrate and by means of which electronic components are contacted.

FIG. 17 shows a schematic sectional view of a carrier 100 according to an exemplary embodiment. Carrier 100 is arranged on substrate 60, which comprises the conductor track 62 and the heat sink 61. The metallization, which is located in the region of the through-connections 10, is in direct contact with conductor tracks 62, which are formed on a side of the substrate 60 facing the carrier 100. The conductor tracks 62 are electrically conductive and electrically insulated from each other by means of the insulation 63. In particular, conductor tracks 62 which are electrically connected with different through-connections 10 are electrically insulated from each other. Furthermore, the thermal connection element 20 is in direct thermal contact with the heat sink 61 via the metallization 50.

On a side of the carrier 100 facing away from the substrate 60, electronic components 80 are arranged on a contact structure 40. Each electronic component 80 can be electrically conductively contacted via a separate through-connection 10. For example, the electronic component 80 is electrically conductively connected by means of a bonding wire to a contact structure 40 which is clearly assigned to the electronic component 80. Heat generated during operation of the electronic component 80 is dissipated particularly efficiently by the thermal connection element 20 and transferred to the heat sink 61. Each electronic component 80 comprises, for example, a semiconductor chip 81 and a conversion element 82. By means of the semiconductor chip 81, for example, electromagnetic radiation is generated during intended operation, which is at least partially converted into electromagnetic radiation of a longer wavelength by means of the conversion element 82.

Figure 18:
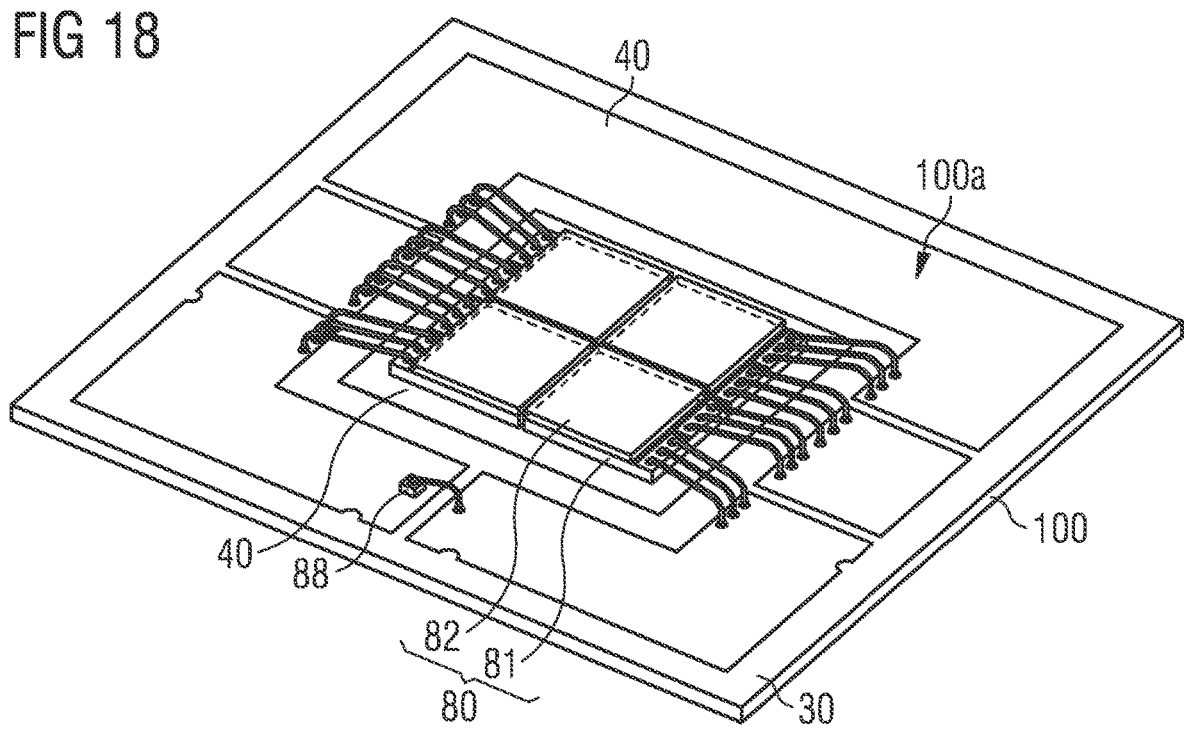
FIG. 18 shows a schematic perspective view of an exemplary embodiment of a carrier with four electronic components.

FIG. 18 shows a schematic perspective view of a carrier 100 described here in accordance with an exemplary embodiment. Four electronic components 80 are arranged on the carrier 100, which are electrically conductively connected to contact structures 40 on a first main surface 100a of the carrier 100. The electronic components 80 are arranged on a common contact structure 40 and are electrically connected via further contact structures 40 using bonding wires. Furthermore, a protective diode 88 is arranged on the first main surface 100a of the carrier 100, by means of which the risk of an electrical flashover and thus of damage to an electronic component or the carrier 100 is reduced.

Figure 19:
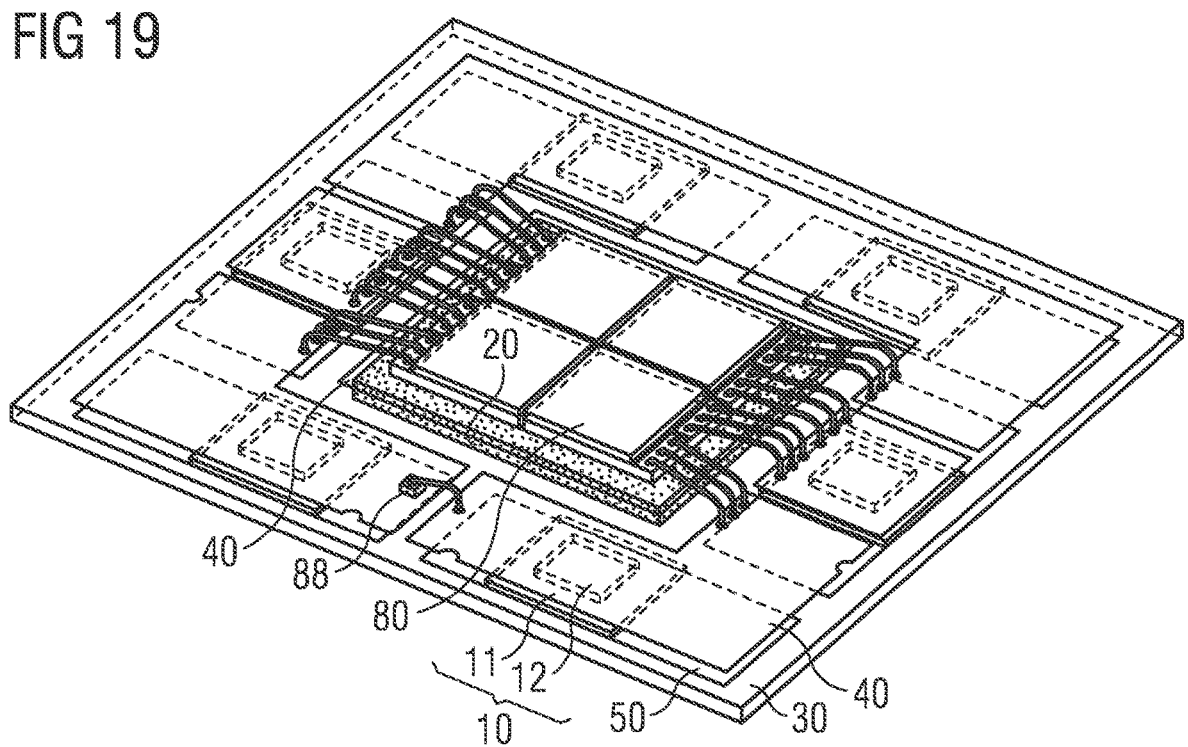
FIG. 19 shows a schematic perspective view of an exemplary embodiment of a carrier with four electronic components, wherein the base material is transparent.

FIG. 19 shows a schematic representation of a carrier 100 described here, in which the base material 30 is shown partially transparent. The through-connections 10 are embedded in the base material 30. The through-connections 10 are completely surrounded by the base material 30 in lateral directions. The through-connections 10 are each step-shaped. Thus, the side surfaces 10a of the through-connections 10 are at least partially not perpendicular to the main plane of the carrier 100. The through-connections 10 are in particular of multi-layer construction, wherein the first sublayer 11 and the second sublayer 12 have a maximum height of 60 μm. The contact structures on the first main surface 100a of the carrier 100 are in direct mechanical contact with the through-connections 10 and/or the thermal connection element 20. In particular, the contact structures 40 are formed with an electrically conductive material. A metallization 50 is arranged on a second main surface 100b of the carrier 100 in the region of the thermal connection element and in the region of the through-connections.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

This patent application claims the priority of German patent application 102017126268.7, the disclosure content of which is hereby incorporated by reference.

REFERENCE SIGNS 10 through-connections
10a side surfaces
11 first sublayer
12 second sublayer
20 thermal connection element
30 base material
40 contact structures
41 seed layer
42 first contact structure layer
43 second contact structure layer
50 metallization
60 substrate
61 heat sink
62 conductor track
63 insulation
70 electronic component
80 electronic component
81 semiconductor chip
82 conversion element
88 protective diode
91 first auxiliary carrier
92 second auxiliary carrier
93 third auxiliary carrier
100 carrier
100a first main surface
100b second main surface
111 first mask
112 second mask
140 third mask
H height

The invention claimed is:

1. A method for producing a carrier comprising the steps:
A) providing an electrically conductive first auxiliary carrier;
B) arranging at least one thermal connection element on the first auxiliary carrier;
C) arranging at least one through-connection on the first auxiliary carrier;
D) applying a base material to the first auxiliary carrier, wherein the base material completely surrounds the through-connection and the thermal connection element in lateral directions;
E) applying contact structures on a side of the thermal connection element and the through-connection facing away from the first auxiliary carrier;
F) arranging a second auxiliary carrier on a side of the contact structures facing away from the first auxiliary carrier;
G) removing the first auxiliary carrier;
H) applying a metallization to a side of the thermal connection element and/or the through-connection facing away from the second auxiliary carrier; and
I) removing the second auxiliary carrier;
wherein
after step I) a substrate is arranged on a side of the metallization facing away from the base material, wherein the substrate comprises at least one conductor track and at least one heat sink;
the metallization, which is arranged in the region of the through-connection, is brought into direct contact with the conductor track; and
the metallization, which is arranged in the region of the thermal connection element, is brought into direct contact with the heat sink.

2. The method according to claim 1, wherein in a step H1), which is carried out after step H), a third auxiliary carrier is arranged on a side of the metallization facing away from the second auxiliary carrier.

3. The method according to claim 1, wherein the through-connection in step C) is produced by means of a photolithographic process.

4. The method according to claim 1, wherein in a step D1), which is carried out after step D), the side of the base material, the through-connection and the thermal connection element facing away from the first auxiliary carrier is planarized.

5. The method according to claim 1, wherein
in step E) a seed layer is applied over the entire surface of the side of the base material, the through-connection and the thermal connection element facing away from the first auxiliary carrier, and
the contact structure is electrodeposited.

6. The method according to claim 1, wherein
a plurality of carriers is produced in steps A) to I), and the carriers are subsequently singulated in a step J).

7. The method according to claim 1, wherein step H) is carried out immediately after step G).

* * * * *